United States Patent [19]

Imamiya et al.

[11] Patent Number: 4,943,962
[45] Date of Patent: Jul. 24, 1990

[54] NONVOLATILE SEMICONDUCTOR MEMORY HAVING PAGE MODE PROGRAMMING FUNCTION

[75] Inventors: Keniti Imamiya, Yokohama; Sumio Tanaka, Oomorinishi; Junichi Miyamoto, Yokohama; Shigeru Atsumi, Tokyo; Nobuaki Ohtsuka; Shinji Saito, both of Yokohama, all of Japan

[73] Assignee: Kabushiki Kaisha Toshiba, Kawasaki, Japan

[21] Appl. No.: 263,752

[22] Filed: Oct. 28, 1988

[30] Foreign Application Priority Data

Oct. 30, 1987 [JP] Japan ................................ 62-275462

[51] Int. Cl.$^5$ .................................................. G11C 11/40
[52] U.S. Cl. ................................ 365/230.08; 365/238.5
[58] Field of Search ....................... 365/189.05, 230.08, 365/233, 238.5

[56] References Cited

U.S. PATENT DOCUMENTS 4,685,084  8/1987  Canepa ........................... 365/230.08

OTHER PUBLICATIONS

M. Fukuda et al., 1 M bit CMOS EPROM "HN27C101"/HN27C301.

T. Hagiwara et al., "Page Mode Programming 1 Mb CMOS EPROM," 1985 IEEE International Solid-State Circuits Conference Digest of Technical Papers, pp. 174-175.

Primary Examiner—Joseph A. Popek
Attorney, Agent, or Firm—Finnegan, Henderson, Farabow, Garrett and Dunner

[57] ABSTRACT

A nonvolatile semiconductor memory of this invention is constituted to latch input data into data latch circuits and at the same time control the programming operation of the bit line load transistors when the chip enable signal is made active and a page programming power source voltage is set at the programming voltage, while the output enable signal is kept inactive. Further, when the output enable signal is made active or the programming power source voltage is set at a voltage different from the programming voltage, the data latch circuits are reset. The data latch circuits can be selectively specified by a preset combination of bits.

19 Claims, 5 Drawing Sheets

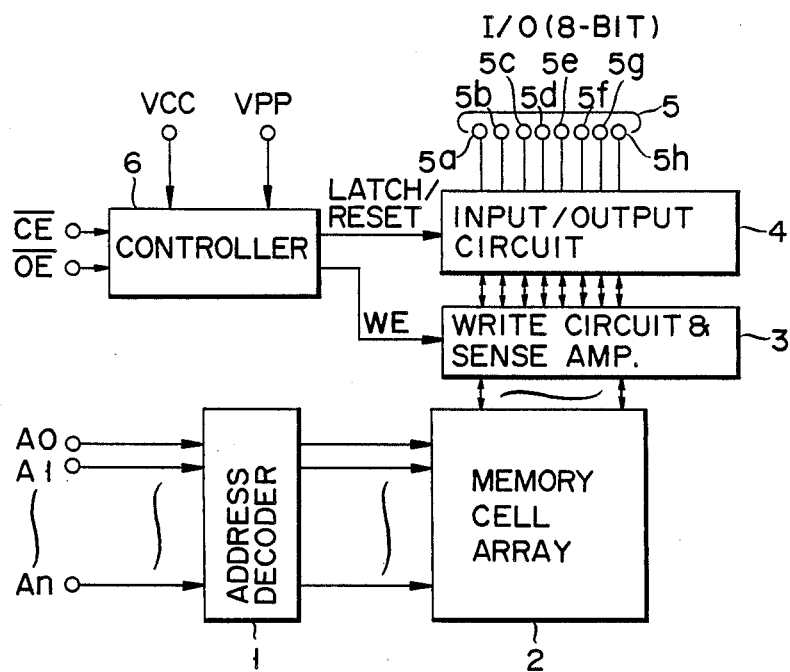
F I G. 1
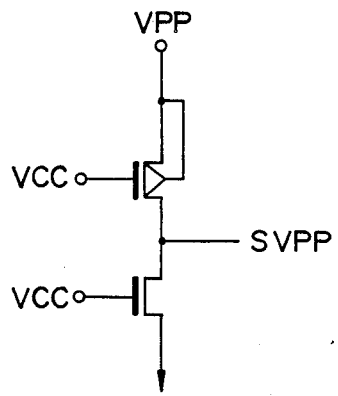
F I G. 1A

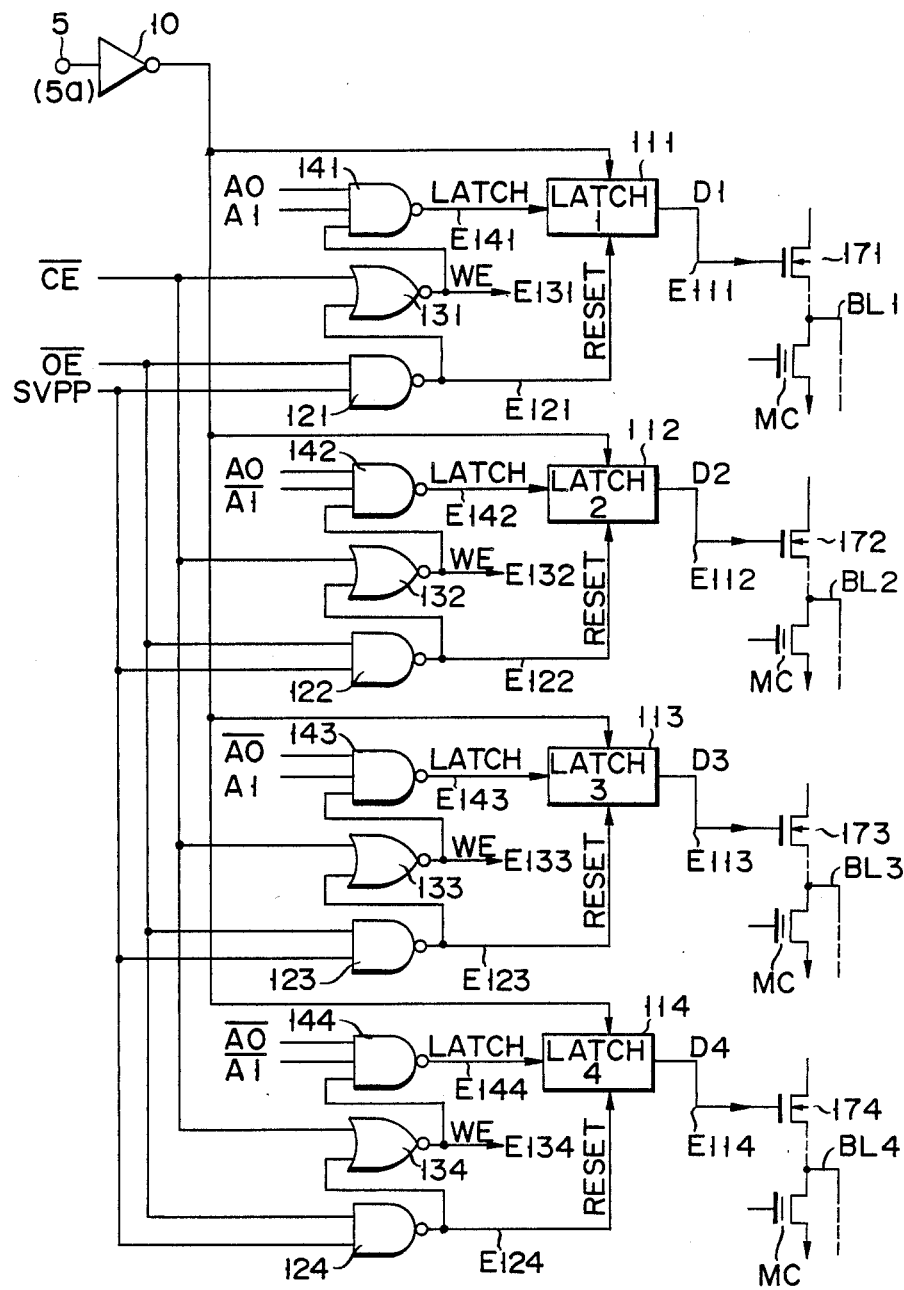
F I G. 2

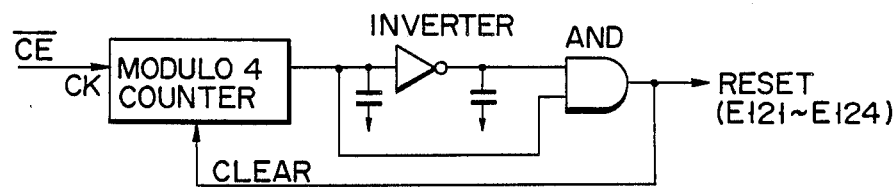
F I G. 6
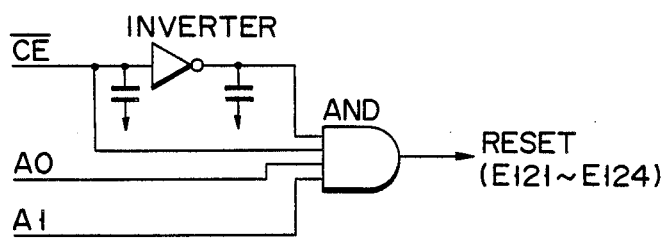
F I G. 7
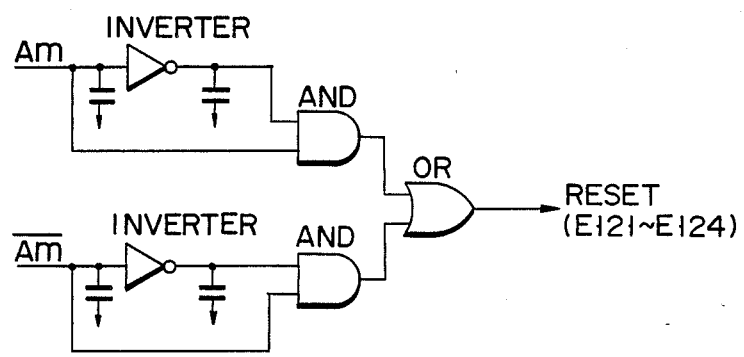
F I G. 8

NONVOLATILE SEMICONDUCTOR MEMORY HAVING PAGE MODE PROGRAMMING FUNCTION

BACKGROUND OF THE INVENTION

1. Field of the Invention

This invention relates to a nonvolatile semiconductor memory, and more particularly to a circuit for latching program data and at the same time programming data.

2. Description of the Related Art

It has been required to shorten the programming time in nonvolatile semiconductor memories such as ultraviolet erasable programmable read only memories (EPROMs) as the memory bit density increases. Therefore, the memories tend to be formed so as to have the page mode programming function of latching program data of several bytes and then simultaneously programming the data into a plurality of memory cells. In general, it is necessary to effect both the page mode programming operation and normal mode programming operation. Conventionally, the page mode and normal mode are selectively specified by a combination of input logic levels of four external input terminals (programming power supply voltage, $\overline{PGM}$ input terminal, chip enable $\overline{CE}$ terminal and output enable $\overline{OE}$ input terminal).

Such a prior art is disclosed in the following documents:

Takaaki Hagiwara, et al.
SESSION XIII: NONVOLATILE MEMORIES
"Page Mode Programming 1 Mb CMOS EPROM",
1985 IEEE International Solid-State Circuits Conference, ISSCC. 85/THURSDAY, FEB. 14, 1985, pp. 174-175

The entire contents disclosed in the above documents are incorporated into this specification.

Part of the conventional EPROM is shown in FIG. 4 and the operation timings thereof is shown in FIG. 5. Data input/output terminal 41 is commonly connected to one end of data latch control transistors 431 to 434 of four bits via inverter circuit 42. The other ends of transistors 431 to 434 are respectively connected to input terminals of latch circuits 441 to 444. The output terminals of latch circuits 441 to 444 are respectively connected to the gates of programming or bit line load transistors 471 to 474 for programming via page mode programming control transistors 451 to 454 and inverter circuits 461 to 464. Transistors 471 to 474 are respectively connected to bit lines BL1 to BL4 which are in turn connected to a plurality of memory cells MC ... via column selection transistors (not shown). Further, the output terminal of inverter circuit 42 is connected to the input terminals of inverter circuits 461 to 464 via normal mode programming control transistors 481 to 484, respectively.

Four data latch controlling transistors 431 to 434 are selected according to a combination of low-order two bits A0 and A1 of address input bits A0 to An when signal $\overline{OE}$ is at a high level. As shown in FIG. 5, in the page mode signal $\overline{PGM}$ and $\overline{CE}$ are both set to a high level. At this time, input data D1 to D4 sequentially supplied to I/O terminal 41 are respectively latched by latch circuits 441 to 444 via data latch controlling transistors 431 to 434 which are sequentially turned on each time signal $\overline{OE}$ is set to a high level. When signal $\overline{PGM}$ is set to a low level, page mode programming transistors 451 to 454 are controlled so as to be turned on at the same time. Then, data in latch circuits 441 to 444 are supplied to load transistors 471 to 474 via inverters 461 to 464 and are thus written into the four-bit memory cells at the same time. Next, in the verify mode in which signal $\overline{PGM}$ is set at a high level and signals $\overline{CE}$ and $\overline{OE}$ are both set at a low level, the programmed data is read out.

In the programming operation of the normal mode, one of normal mode programming control transistors 481 to 484 is selected according to address input bits A0 and A1, and input data is programmed via the selected load transistor.

As described above, three signals $\overline{PGM}$, $\overline{CE}$ and $\overline{OE}$ can be variously combined to selectively set various modes of operations of the normal mode programming, page mode programming, programming inhibition, verify, latching of page mode programming data and the like.

In a case where $\overline{PGM}$ signal is omitted and only the remaining signals $\overline{CE}$ and $\overline{OE}$ are used, the circuit of FIG. 4 cannot be used. In order to solve the problem, the following method can be considered. That is, data may be latched in a short low-level period (T1) of signal $\overline{CE}$, and the latched data may be programmed or written in a long low-level period (T2) of $\overline{CE}$ signal. In this case, signal $\overline{OE}$ is kept at a high level in the page mode programming operation, and is set to a low level for each data output. Further, in this case, when it is determined by use of a timer that a preset period of time (long low-level period of signal $\overline{CE}$) has elapsed after signal $\overline{CE}$ was set to a low level in the normal mode programming operation, data is started to be programmed.

However, time loss occurs before the beginning of programming in the normal mode programming operation effected by use of the timer, and necessary programming time becomes longer. In other words, when it is desired to control the page mode programming and normal mode programming operations according to two control signals, the programming time in the normal programming operation will become longer.

SUMMARY OF THE INVENTION

An object of this invention is to provide a nonvolatile semiconductor memory in which both the page mode programming and normal mode programming operations can be achieved according to two control signals, for example, a chip enable signal ($\overline{CE}$) and output enable signal ($\overline{OE}$), and the data programming time can be reduced by latching data in both modes and at the same time programming the data.

The nonvolatile semiconductor memory of this invention is constituted to latch or load the input data (D1 to D4) into a data latch circuit (111 to 114) and, at the same time, to control the programming operation of the load transistors (171 to 174) when the chip enable signal is made active ($\overline{CE}=0$) and a programming power source voltage (Vpp) is set at the programming voltage (SVpp=1), while the output enable signal is kept inactive ($\overline{OE}=1$). Further, when the output enable signal is made active ($\overline{OE}=0$) or the programming power source voltage (Vpp) is set at a voltage different from the programming voltage (SVpp=0), the data latch circuits (111 to 114) are reset. The data latch circuits (111 to 114) can be selectively specified by a preset combination of bits (A0, $\overline{A0}$, A1, $\overline{A1}$).

With the above construction, in the page mode operation (FIGS. 3A to 3E), input data (D1 to D4) are sequentially latched by changing address inputs (A0, A1), and at the same time, the latched input data is written or programmed into memory cells connected to the latch. In the normal mode programming operation (FIGS. 3F to 3J), preset address inputs (A0, A1) are supplied so as to render input data (for example, one bit of 8-bit data or 16-bit data) to be latched and, at the same time, programmed.

The latched data can be reset when the programming power source voltage is set to a voltage different from the programming voltage, or by activating the output enable signal ($\overline{OE}$=0). Therefore, the page mode programming and normal mode programming operations can be selectively set by a combination of the output enable signal ($\overline{OE}$) and chip enable signal ($\overline{CE}$). Further, since input data can be latched and at the same time programmed in the normal mode programming operation, the programming time can be reduced.

BRIEF DESCRIPTION OF THE DRAWINGS

FIG. 1 is a block diagram schematically showing a nonvolatile semiconductor memory according to one embodiment of this invention;

FIG. 1A shows an example of a circuit for detecting input program voltage Vpp and generating programming mode signal SVpp;

FIG. 2 shows an example of a circuit which is provided for each I/O terminal and arranged in the nonvolatile semiconductor memory according to one embodiment of this invention;

FIG. 6 shows a reset signal generating circuit combined with the circuit of FIG. 2 to constitute another embodiment of this invention;

FIG. 7 shows a reset signal generating circuit combined with the circuit of FIG. 2 to constitute still another embodiment of this invention; and FIG. 8 shows a reset signal generating circuit combined with the circuit of FIG. 2 to constitute still another embodiment of this invention.

DETAILED DESCRIPTION OF THE PREFERRED EMBODIMENTS

Figure 3:
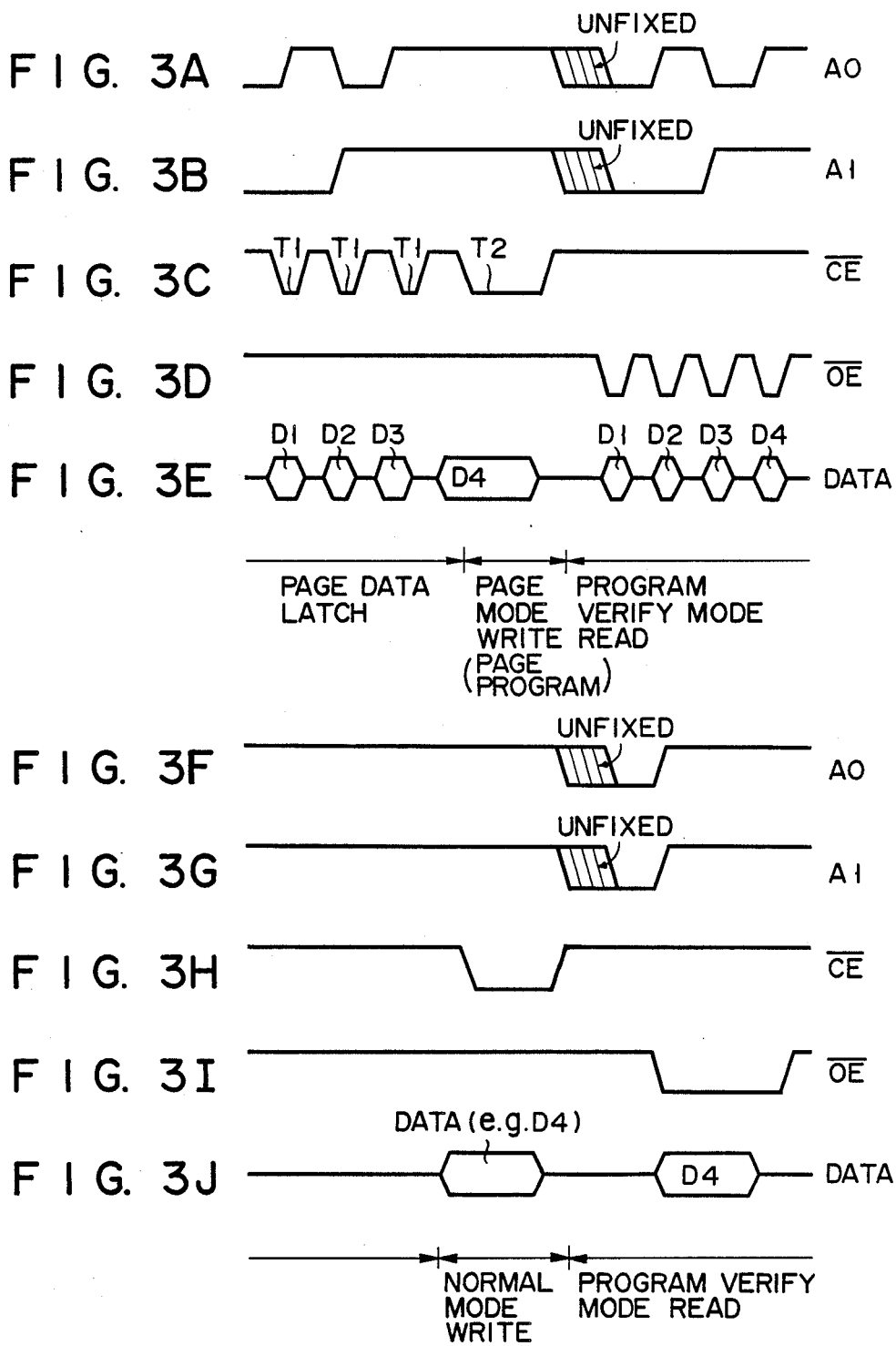
FIG. 3 is a timing chart for illustrating the operation of the circuit shown in FIG. 2, FIGS. 3A to 3E illustrating the page mode programming operation and FIGS. 3F to 3G illustrating the normal mode programming operation.
Figure 4:
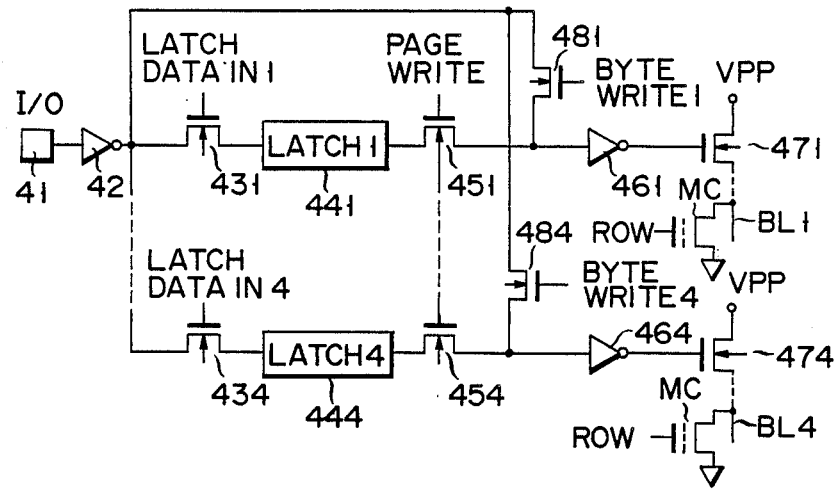
FIG. 4 shows an example of a circuit provided in the conventional nonvolatile semiconductor memory.
Figure 5:
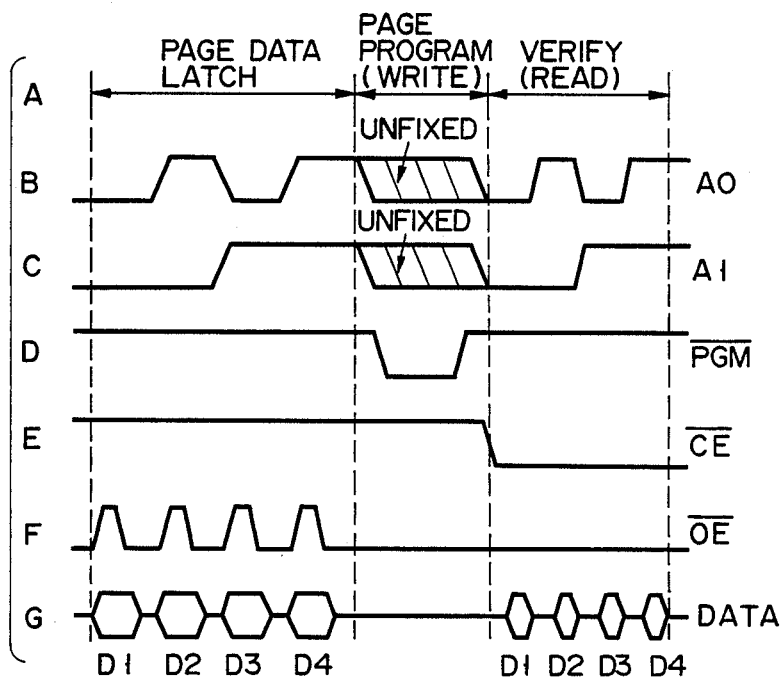
FIG. 5 is a timing chart for illustrating the operation of the circuit shown in FIG. 4.

There will now be described an embodiment of this invention in detail with reference to the accompanying drawings.

FIG. 1 shows a schematic construction of an 8-bit EPROM, for example. In FIG. 1, A0 to An denote address inputs, 1 an address decoder for selectively designating the address of memory cell array 2 according to an address input signal, and 3 a programming-/sense amplifier for effecting data programming and readout with respect to memory cell array 2. Further, 4 denotes an input/output (I/O) circuit for inputting and outputting data with respect to programming circuit/sense amplifier 3, 5 (5a to 5h) data I/O terminals connected to I/O circuit 4, and 6 a control circuit for controlling the memory operation based on power source voltage Vcc, program voltage Vpp, chip enable signal $\overline{CE}$, and output enable signal $\overline{CE}$.

FIG. 2 shows an input data latching and data programming circuit which is provided for each of eight data I/O terminals 5a to 5h in the above EPROM and in which the page mode programming of 4-bit data and the normal mode programming of 1-bit data can be selectively effected, for example. In FIG. 2, 5 denotes a data I/O terminal corresponding to 5a in FIG. 1, for example, 10 an input buffer (inverter), and 111 a data latch circuit to which input data (D1) is supplied via input buffer 10. Further, 121 denotes a two-input NAND circuit to which output enable signal $\overline{OE}$ and programming mode signal SVpp of high level ("1" level) generated in the EPROM are supplied in the programming mode (programming voltage Vpp is at a high voltage level). 131 denotes a two-input NOR circuit to which output E121 of NAND circuit 121 and chip enable signal $\overline{CE}$ are supplied. 141 denotes a three-input NAND circuit connected to receive output E131 of NOR circuit 131, and low-order two bits A0 and A1 of the address input bits A0 to An. Output E131 of NOR circuit 131 is used as write enable signal WE and it becomes active when set at a high level (WE=1).

Output E141 of NAND circuit 141 is supplied as a latch set signal to latch circuit 111, and it becomes active when set at a low level (E141=0). Output E111 of data latch circuit 111 is supplied to the gate of load transistor 171 connected in series with bit line BL1 in the memory cell array (2). Latch circuit 111 is set or made active in response to the fall (1→0) of signal E141 and reset in response to the rise (0→1) of signal E121. Further, signal SVpp can be obtained by a comparator shown in FIG. 1A. The voltage level of Vpp which causes SVpp to be set to "1" depends on Vcc.

Four circuits of the same construction as that of data latch circuit 111 are provided to effect the page mode programming of 4-bit data. Input data to data I/O terminal 5 is supplied to four data latch circuit 111 to 114 via input buffer (inverter) 10. Address bits are supplied to four NAND circuits 141 to 144 in the form of different combinations of A0, $\overline{A0}$, A1 and $\overline{A1}$. Outputs E111 to E114 of data latch circuits 111 to 114 are respectively supplied to load transistors 171 to 174 provided for four bit lines BL1 to BL4.

There will now be described an operation of the EPROM with reference to FIG. 3. When programming power source voltage Vpp is set at the programming voltage (Vpp=12 V, for example), programming mode signal SVpp (active) is generated from the comparator of FIG. 1A having a comparison level slightly lower than Vpp. When signal $\overline{OE}$ (FIG. 3D) is set at an active level (low level), output signals E121 to E124 of NAND circuits 121 to 124 are set to be high levels.

In the page mode programming operation, input data D1 to D4 (FIG. 3E) are sequentially supplied to inverter 10 to change the combination of address bits A0, $\overline{A0}$, A1 and $\overline{A1}$ (FIGS. 3A and 3B show the combination of outputs of A0 and A1). Signal $\overline{CE}$ is made active (low level) in synchronism with the sequential variation of the address bits. At this time, outputs E131 to E134 (=WE signal) of NOR circuits 131 to 134 are made active (high level) each time signal $\overline{CE}$ is set to a low level. Further, outputs E141 to E144 of NAND circuits 141 to 144 are sequentially made active (low level), and input data D1 to D4 are sequentially latched in data latch circuits 111 to 114. Input data D1 to D4 are thus latched and at the same time supplied from latch circuits 111 to 114 to load transistors 171 to 174. In this way, data is programmed or written and the programming operation of the latched data is continuously effected as long as the WE signal (E131 to E134) is kept active.

Since signal $\overline{CE}$ is inactive (high level) in the verify mode, output signals E131 to E134 of NOR circuits 131 to 134 become inactive (low level) and output signals E141 to E144 of NAND circuits 141 to 144 also become inactive (high level). Then, each time signal $\overline{OE}$ (FIG. 3D) is made active (low level), readout data (D1 to D4) are sequentially output. Outputs E121 to E124 generated from NOR circuits 121 to 124 when signal $\overline{OE}$ is first made active are supplied as reset signals to data latch circuits 111 to 114, thus resting the same. Also, when programming power source voltage Vpp is set to a voltage different from the programming voltage, signal SVpp is set to a low level and outputs E121 to E124 of NOR circuits 121 to 124 are set to a high level, thus effecting the same resting operation as described above.

The normal mode programming operation is similar to the page mode programming operation except the following respects. That is, a latch signal (E144) is generated from one (144) of NAND circuit 141 to 144 specified by a combination of bits A0, $\overline{A0}$, A1 and $\overline{A1}$ (FIGS. 3F and 3G) when signal $\overline{CE}$ (FIG. 3H) is made active in synchronism with one (for example, D4) of input data D1 to D4. Then, the input data (D4) is latched into one (114) of the data latch circuits corresponding to the output latch signal (E144) and the latched data is written by means of one (171) of the load transistors connected to the corresponding data latch circuit (114). In the case of normal mode programming operation, as soon as one-bit input data (FIG. 3J) is latched, the one-bit data is programmed. Therefore, the writing time will not be made longer. After this, when signal $\overline{OE}$ (FIG. 3I) becomes active (low level) or when programming mode signal SVpp becomes inactive (low level), a reset signal (E124) becomes high level, thus resting the data latch circuit (114).

In the above embodiment, signal $\overline{OE}$ is set to a low level in order to effect the reset operation after the completion of the page mode programming operation. In a case where signal $\overline{OE}$ is not set to a low level, a reset signal generating circuit as shown in FIG. 6 may be used to count the number of times which signal $\overline{CE}$ becomes inactive (high level) and reset data latch circuits 111 to 114 when the count value becomes four.

Further, in the above embodiment, the address bits are not used to effect the reset operation after the completion of the normal mode programming operation. However, it is possible to use a reset signal generating circuit as shown in FIG. 7 which resets data latch circuits 111 to 114 in response to change of signal $\overline{CE}$ when address bits A0 and A1 are both set at a high level. In this case, if addresses other than A0 and A1 are not changed before the latch data is reset, it is possible to effect the normal mode programming operation starting from any one of the addresses.

It is also possible to use a reset signal generating circuit as shown in FIG. 8 which resets the latch data when address Am other than A0 and A1 is changed even by one bit (in FIG. 8, m is an integer of 2 to n). The same circuits as the reset signal generating circuit of FIG. 8 are used for all the circuits (FIG. 2) dealing with addresses A2 to An. With this construction, even if signal $\overline{OE}$ is kept at a high level, it becomes possible to effect the normal mode programming operation in which data can be programmed at any desired address as in the prior art.

As described above, according to this invention, the page mode and normal mode programming operations can be selectively set by $\overline{CE}$ and $\overline{OE}$ signals. Since data programming can be effected at the same time as the data latching operation in both modes, the programming time can be set to be shorter in comparison with the prior art.

What is claimed is:

1. A nonvolatile semiconductor memory having programming control transistors for controlling data programming into memory cells and receiving input data, address input, chip enable signal, output enable signal, and programming power source voltage, comprising:
    set signal generating means for generating set signals in response to the chip enable signal set to be active and the address input when the programming power source voltage is at a preset programming voltage and the output enable signal is inactive; and
    latch circuit means, coupled to said set signal generating means, for latching, in response to the set signal, the input data and at the same time supply the latched data to said programming control transistors corresponding to the address input, thus programming the latched data into said memory cells corresponding to the address input.

2. A nonvolatile semiconductor memory according to claim 1, further comprising:
    reset signal generating means for generating a reset signal when the output enable signal becomes active or when the programming power source voltage becomes lower than the preset programming voltage;
    wherein said latch circuit means is reset by the reset signal from said reset signal generating means.

3. A nonvolatile semiconductor memory according to claim 2, wherein said reset signal generating means includes means for generating a programming mode signal when the programming power source voltage is set at the preset programming voltage, and means for generating the reset signal in response to the programming mode signal and the output enable signal.

4. A nonvolatile semiconductor memory according to claim 2, wherein said reset signal generating means includes:
    logic circuit means for generating the reset signal in response to the output enable signal and a programming mode signal generated when the programming power source voltage is at the preset programming voltage.

5. A nonvolatile semiconductor memory according to claim 4, wherein said set signal generating means includes:
    logic circuit means for generating the set signal in response to the reset signal, chip enable signal and address input.

6. A nonvolatile semiconductor memory according to claim 1, further comprising:
    reset signal generating means for counting the number of times of chip enable signal level changes, and generating a reset signal when the counted value has reached a predetermined value;
    wherein said latch circuit means is reset by the reset signal generated from said reset signal generating means.

7. A nonvolatile semiconductor memory according to claim 6, wherein the predetermined value of the counted value corresponds to the maximum number of available combinations of the address bits input to said set signal generating means.

8. A nonvolatile semiconductor memory according to claim 1, further comprising:
   reset signal generating means for generating a reset signal when detecting variation in level of the chip enable signal while the input address bits to be received are both set at a predetermined logic level;
   wherein said latch circuit means is reset by the reset signal generated from said reset signal generating means.

9. A nonvolatile semiconductor memory according to claim 1, further comprising:
   reset signal generating means for generating a reset signal when detecting variation in level of address input other than the address input to be received,
   wherein said latch circuit means is reset by the reset signal generated from said reset signal generating means.

10. A nonvolatile semiconductor memory having memory cells for storing input data comprising:
    programming control transistors for controlling data programming with respect to said memory cells;
    a latch circuit for latching the input data and supplying the latched data to said programming control transistors; and means for activating said programming control transistors to write the latched data into said memory cells, at the time when the input data is latched by said latch circuit.

11. A nonvolatile semiconductor memory according to claim 10, which receives address input, chip enable signal, output enable signal and program power source voltage and which further comprises:
    first means for generating a set signal in response to the setting of the chip enable signal to an active level and the address input when the programming power source voltage is at a preset programming voltage and the output enable signal is inactive; and
    wherein the latch circuit includes latch circuit means for latching the input data and at the same time supplying the latched data to said programming control transistors corresponding to the address input in response to the set signal, thus programming the latched data into said memory cells corresponding to the address input.

12. A nonvolatile semiconductor memory according to claim 11, further comprising:
    second means for generating a reset signal when the output enable signal becomes active or when the programming power source voltage becomes lower than the preset programming voltage;
    wherein said latch circuit means is reset by the reset signal.

13. A nonvolatile semiconductor memory according to claim 12, wherein said second means includes means for generating a programming mode signal when the programming power source voltage is set at the preset programming voltage, and means for generating the reset signal in response to the programming mode signal and the output enable signal.

14. A nonvolatile semiconductor memory according to claim 12, wherein said second means includes:
    means for generating the reset signal in response to the output enable signal and a programming mode signal generated when the programming power source voltage is at the preset programming voltage.

15. A nonvolatile semiconductor memory according to claim 14, wherein said first means includes:
    means for generating the set signal in response to the reset signal, chip enable signal and address input.

16. A nonvolatile semiconductor memory according to claim 11, further comprising:
    means for counting the number of times of chip enable signal level changes, and generating a reset signal when the counted value has reached a predetermined value;
    wherein said latch circuit means is reset by the reset signal.

17. A nonvolatile semiconductor memory according to claim 16, wherein the predetermined value of the counted value corresponds to the maximum number of available combinations of the address bits input to said first means.

18. A nonvolatile semiconductor memory according to claim 11, further comprising:
    means for generating a reset signal when detecting variation in level of the chip enable signal while the input address bits to be received are both set at a predetermined logic level;
    wherein said latch circuit means is reset by the reset signal.

19. A nonvolatile semiconductor memory according to claim 11, further comprising:
    means for generating a reset signal when detecting variation in level of address input other than the address input to be received;
    wherein said latch circuit means is reset by the reset signal.

* * * * *